United States Patent
Yoon et al.

(10) Patent No.: US 10,884,557 B2
(45) Date of Patent: Jan. 5, 2021

(54) TOUCH INPUT DEVICE

(71) Applicant: Korea Advanced Institute of Science And Technology, Daejeon (KR)

(72) Inventors: Jun-Bo Yoon, Daejeon (KR); Jaeyoung Yoo, Daejeon (KR); Min-Ho Seo, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 130 days.

(21) Appl. No.: 16/107,316

(22) Filed: Aug. 21, 2018

(65) Prior Publication Data

US 2019/0064965 A1 Feb. 28, 2019

(30) Foreign Application Priority Data

Aug. 22, 2017 (KR) .................. 10-2017-0106063
Sep. 28, 2017 (KR) .................. 10-2017-0126600

(51) Int. Cl.
G06F 3/044 (2006.01)
G06F 3/041 (2006.01)
H03K 17/96 (2006.01)

(52) U.S. Cl.
CPC ............ G06F 3/044 (2013.01); G06F 3/0416 (2013.01); *G06F 2203/04107* (2013.01); *H03K 17/9622* (2013.01); *H03K 2217/960775* (2013.01)

(58) Field of Classification Search
CPC ......... G06F 2203/04107; G06F 3/0416; G06F 3/044; H03K 17/9622; H03K 2217/960775
See application file for complete search history.

(56) References Cited

U.S. PATENT DOCUMENTS

| 4,290,052 A | * | 9/1981 | Eichelberger | ........... G06F 3/044 341/33 |
| 9,810,814 B2 | * | 11/2017 | Lee | ........ G06F 3/0412 |
| 2008/0246735 A1 | * | 10/2008 | Reynolds | ................ G06F 3/016 345/173 |

(Continued)

FOREIGN PATENT DOCUMENTS

| KR | 10-2016-0053906 A | 5/2016 |
| KR | 10-1742052 B1 | 5/2017 |

OTHER PUBLICATIONS

Office Action dated Jun. 12, 2018 in related Korean Appl. 10-2017-0106063 (5 pgs.).

*Primary Examiner* — Amy Onyekaba
(74) *Attorney, Agent, or Firm* — Foley & Lardner LLP

(57) ABSTRACT

A touch input device which detects a touch position and a touch pressure magnitude may be provided that includes: a display module; a first electrode and a second electrode which are disposed on the display module and are spaced apart from each other; a spacer layer which is formed on the display module and covers the first electrode and the second electrode; and a transparent ground electrode which is disposed on the spacer layer and is formed of a material having transparency. A distance between the transparent ground electrode and the display module is changed by inputting a touch on the transparent ground electrode, and a capacitance between the first electrode and the second electrode is changed by the distance change. The position of the touch and the pressure magnitude of the touch are detected based on the changed capacitance.

19 Claims, 13 Drawing Sheets

(56) References Cited

U.S. PATENT DOCUMENTS

| | | | |
|---|---|---|---|
| 2009/0046078 A1* | 2/2009 | Kent | G06F 3/045 345/176 |
| 2010/0134429 A1* | 6/2010 | You | G06F 3/044 345/173 |
| 2010/0265211 A1* | 10/2010 | Oishi | G06F 3/044 345/174 |
| 2011/0102366 A1* | 5/2011 | Juan | G06F 3/044 345/174 |
| 2012/0075241 A1* | 3/2012 | Bao | G06F 3/044 345/174 |
| 2012/0188181 A1* | 7/2012 | Ha | G06F 3/041 345/173 |
| 2013/0161179 A1* | 6/2013 | Tamura | G06F 3/0414 200/600 |
| 2013/0175148 A1* | 7/2013 | Hisatsugu | H01H 59/00 200/181 |
| 2014/0028569 A1* | 1/2014 | Guard | G06F 3/044 345/173 |
| 2014/0192006 A1* | 7/2014 | Rathnam | G09G 3/3406 345/174 |
| 2015/0022735 A1* | 1/2015 | Hsu | G06F 3/044 349/12 |
| 2015/0268802 A1* | 9/2015 | Kim | G06F 3/04842 715/763 |
| 2016/0070398 A1* | 3/2016 | Worfolk | G06F 3/0446 345/174 |
| 2016/0202800 A1 | 7/2016 | Itaya et al. | |
| 2017/0131591 A1* | 5/2017 | Rantala | C08K 3/28 |
| 2017/0357345 A1* | 12/2017 | Ikeda | H01L 27/323 |

* cited by examiner

TOUCH INPUT DEVICE

CROSS REFERENCE TO RELATED APPLICATIONS

This application claims priority to South Korean Appl. No. 10-2017-0106063, filed Aug. 22, 2017; and to South Korean Appl. No. 10-2017-0126600, filed Sep. 28, 2017; the contents of both of which are incorporated by reference herein in their entirety.

BACKGROUND

Field

The present disclosure relates to a touch input device and more particularly to a touch input device capable of detecting a touch position and a touch pressure magnitude.

Description of the Related Art

Various kinds of input devices for operating a computing system, such as a button, key, joystick, touch screen, etc., are being developed and used. The touch screen has a variety of advantages, e.g., ease of operation, miniaturization of products and simplification of the manufacturing process, so that the most attention is paid to the touch screen.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and a position of the touch on the touch screen and analyzes the touch, and thus, performs operations in accordance with the analysis.

A capacitive pressure sensor is capable of recognizing dynamic/static pressures and has no power consumption, and thus, is advantageous for being used as a pressure sensor. A high performance capacitive pressure sensor is recently integrated in the mobile display panel. As a result, the high performance capacitive pressure sensor is used as a force touch sensor capable of recognizing not only whether a touch occurs or not but also the pressure of the touch.

However, the capacitive force touch sensor developed so far operates such that the touch sensor is formed before the display panel and the pressure sensor is disposed behind the display panel or at the corners, so that the touch and the pressure are distinguished. This is because when a touch by an object occurs, a base capacitance is changed (reduced), so that it is difficult to actually measure a pressure only-based signal by the object.

Conventional mobile devices recognize not only whether the touch occurs or not but also the magnitude of the applied pressure in order to easily realize various functions even by a single touch. For this purpose, in the conventional mobile devices, a touch sensor for recognizing the position of the touch (2D touch) is integrated, and a force sensor for recognizing the strength of the touch (3D touch) is integrated as well.

Although the position of the touch can be recognized by using the force sensor, there are following problems. A fine touch cannot be recognized due to the lack of sensitivity. The reliability of the multi-touch is decreased due to crosstalk. The transmittance is decreased due to the upper and lower electrode and a thick insulating layer.

FIG. 1 is a schematic cross sectional view of a conventional mobile device.

Referring to FIG. 1, in a conventional mobile device, a touch sensor 10 is integrated on the upper layer and a force sensor 20 is integrated on the lower layer. In such a conventional mobile device, since the touch sensor 10 and the force sensor 20 are integrated in the vertical direction, the sensors 10 and 20 for detecting the touch position and the magnitude of the pressure becomes thicker. In addition, the light transmittance is reduced due to the electrode layers 21 and 23 constituting the force sensor 20 and the insulating layer 25 located between the electrode layers 21 and 23.

FIG. 2 is a conceptual view showing the operation principle of a conventional touch sensor.

As shown in FIG. 2, the conventional touch sensor has an advantage of being able to recognize a fine touch, however, has a disadvantage in that the reliability is reduced by the change of the capacitance Cm due to the external environment.

FIG. 3 is a conceptual view showing the operation principle of a conventional force sensor.

As shown in FIG. 3, the conventional force sensor has an advantage of being able to recognize the strength of the touch, however, has disadvantages in that it is almost impossible to recognize the pressure of a fine touch because the sensitivity is reduced when integrated in a mobile device, the reliability of the multi-touch is decreased due to crosstalk, and the light transmittance is reduced due to two electrode layers and a thick insulating layer located between the two electrode layers.

SUMMARY

One embodiment is a touch input device detecting a touch position and a touch pressure magnitude. The touch input device includes: a display module; a first electrode and a second electrode which are disposed on the display module and are spaced apart from each other; a spacer layer which is formed on the display module and covers the first electrode and the second electrode; and a transparent ground electrode which is disposed on the spacer layer and is formed of a material having transparency. The transparent ground electrode is disposed at a height equal to or greater than a height at which an electric field region is formed between the first electrode and the second electrode. A distance between the transparent ground electrode and the display module is changed by inputting a touch on the transparent ground electrode, and a dielectric constant between the first electrode and the second electrode is increased by the distance change and thus a capacitance between the first electrode and the second electrode is increased. A position of the touch and a pressure magnitude of the touch are detected based on the increased capacitance.

Another embodiment is a touch input device which detects a position of a touch input to a touch surface and a pressure magnitude of the touch. The touch input device includes: a plurality of sensors; an insulating layer which is disposed on the plurality of sensors, is composed of an elastic material, and includes a plurality of conductive materials; and a ground layer which is disposed on the insulating layer and is disposed on some sensors among the plurality of sensors.

Other details of the present invention are included in the detailed description and drawings.

DETAILED DESCRIPTION

The features, advantages and method for accomplishment of the present invention will be more apparent from referring to the following detailed embodiments described as well as the accompanying drawings. However, the present invention is not limited to the embodiment to be disclosed below and is implemented in different and various forms. The embodiments bring about the complete disclosure of the present invention and are only provided to make those skilled in the art fully understand the scope of the present invention. The present invention is just defined by the scope of the appended claims. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention.

While terms such as the first and the second, etc., can be used to describe various components, the components are not limited by the terms mentioned above. The terms are used only for distinguishing between one component and other components. Therefore, the first component to be described below may be the second component within the spirit of the present invention.

Terms used in the present specification are provided for description of only specific embodiments of the present invention, and not intended to be limiting. In the present specification, an expression of a singular form includes the expression of plural form thereof if not specifically stated. The terms "comprises" and/or "comprising" used in the specification is intended to specify characteristics, numbers, steps, operations, components, parts or any combination thereof which are mentioned in the specification, and intended not to exclude the existence or addition of at least one another characteristics, numbers, steps, operations, components, parts or any combination thereof.

Unless differently defined, all terms used herein including technical and scientific terms have the same meaning as commonly understood by one of ordinary skill in the art to which the present invention belongs. Also, commonly used terms defined in the dictionary should not be ideally or excessively construed as long as the terms are not clearly and specifically defined in the present application.

Hereinafter, embodiments in accordance with the present invention will be described with reference to the accompanying drawings. The preferred embodiments are provided so that those skilled in the art can sufficiently understand the present invention, but can be modified in various forms and the scope of the present invention is not limited to the preferred embodiments.

Figure 4:
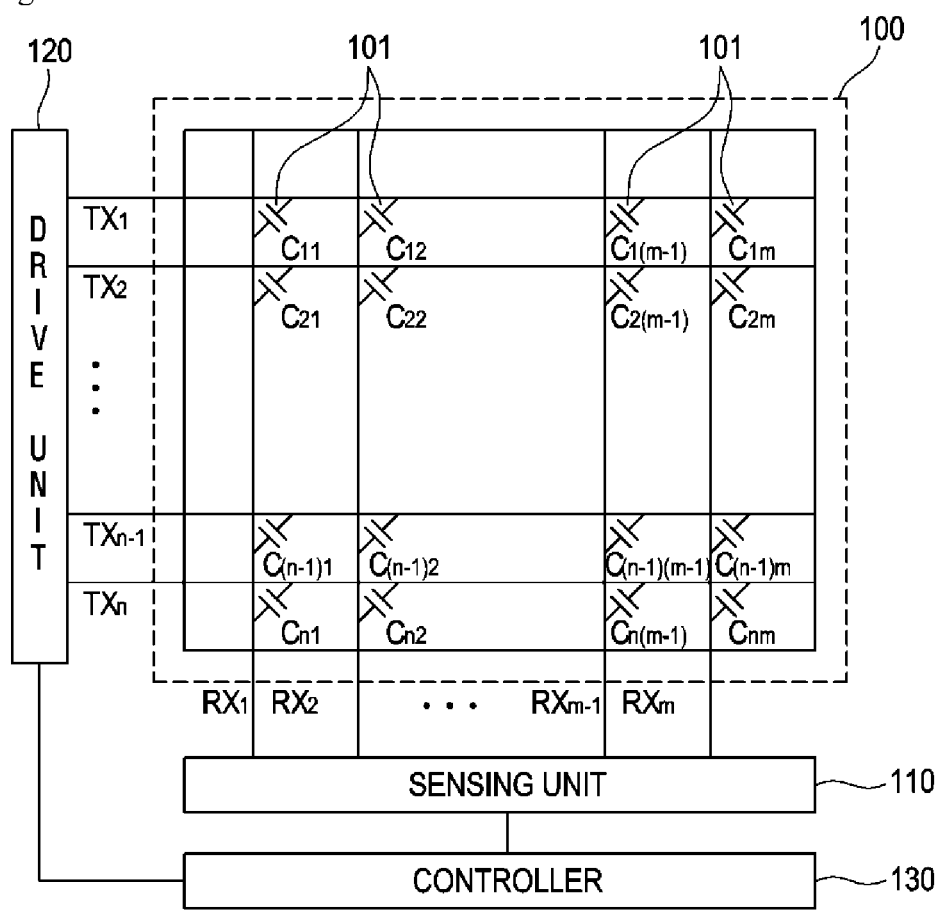
FIG. 4 is a schematic view showing a capacitive touch sensor panel and the configuration for the operation of the same.

FIG. 4 is a schematic view showing a capacitive touch sensor panel and the configuration for the operation of the same. Referring to FIG. 4, a touch sensor panel 100 includes a plurality of drive electrodes TX1 to TXn and a plurality of receiving electrodes RX1 to RXm.

For the purpose of the operation of the touch sensor panel 100, a touch input device according to the embodiment of the present invention may include a drive unit 120 which applies a drive signal to the plurality of drive electrodes TX1 to TXn for the purpose of the operation of the touch sensor panel 100, and a sensing unit 110 which detects the touch and the touch position by receiving a sensing signal including information on the capacitance change amount changing according to the touch on the touch surface of the touch sensor panel 100.

As shown in FIG. 4, the touch sensor panel 100 may include the plurality of drive electrodes TX1 to TXn and the plurality of receiving electrodes RX1 to RXm. While FIG. 4 shows that the plurality of drive electrodes TX1 to TXn and the plurality of receiving electrodes RX1 to RXm of the touch sensor panel 100 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitudes of the values may be different from each other.

As shown in FIG. 4, the plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

In the touch sensor panel 100 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulating layer (not shown). Also, the plurality of drive electrodes TX1 to TXn and the plurality of receiving electrodes RX1 to RXm may be formed in different layers. For example, the plurality of drive electrodes TX1 to TXn and the plurality of receiving electrodes RX1 to RXm may be formed on both sides of one insulating layer (not shown) respectively, or the plurality of drive electrodes TX1 to TXn may be formed on a side of a first insulating layer (not shown) and the plurality of receiving electrodes RX1 to RXm may be formed on a side of a second insulating layer (not shown) different from the first insulating layer.

The drive unit 120 may apply a drive signal to the drive electrodes TX1 to TXn. In the touch input device 1000 according to the embodiment of the present invention, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time.

Through the receiving electrodes RX1 to RXm, the sensing unit 110 receives the sensing signal including information on a capacitance (Cm) 101 generated between the receiving electrodes RX1 to RXm and the drive electrodes TX1 to TXn to which the drive signal has been applied, thereby detecting whether or not the touch has occurred and the touch position. For example, the sensing signal may be a signal coupled by the capacitance (Cm) 101 generated between the receiving electrode RX and the drive electrode TX to which the drive signal has been applied. As such, the process of sensing the drive signal applied from the first drive electrode TX1 to the n-th drive electrode TXn through the receiving electrodes RX1 to RXm can be referred to as a process of scanning the touch sensor panel 100.

For example, the sensing unit 110 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver.

The negative input terminal of the amplifier is connected to the corresponding receiving electrode RX and receives and integrates a current signal including information on the capacitance (CM) 101, and then converts the integrated current signal into voltage. The sensing unit 110 may further include an analog to digital converter (ADC) (not shown) which converts the integrated data by the receiver into digital data. Later, the digital data may be input to a processor (not shown) and processed to obtain information on the touch on the touch sensor panel 100. The sensing unit 110 may include the ADC and processor as well as the receiver.

A controller 130 may perform a function of controlling the operations of the drive unit 120 and the sensing unit 110. For example, the controller 130 generates and transmits a drive control signal to the drive unit 120, so that the drive signal can be applied to a predetermined drive electrode TX1 at a predetermined time. Also, the controller 130 generates and transmits the drive control signal to the sensing unit 110, so that the sensing unit 110 may receive the sensing signal from the predetermined receiving electrode RX at a predetermined time and perform a predetermined function.

In FIG. 4, the drive unit 120 and the sensing unit 110 may constitute a touch detection device (not shown) capable of detecting whether or not the touch has occurred on the touch sensor panel 100 of the touch input device according to the embodiment and the touch position.

The touch input device according to the embodiment may further include the controller 130. In the embodiment, the touch input device including the touch sensor panel 100 may be integrated and implemented on a touch sensing integrated circuit (IC) in a touch input device 1000 including the touch sensor panel 100. The drive electrode TX and the receiving electrode RX included in the touch sensor panel 100 may be connected to the drive unit 120 and the sensing unit 110 included in a touch sensing IC (not shown) through, for example, a conductive trace and/or a conductive pattern printed on a circuit board, or the like.

Figure 1:
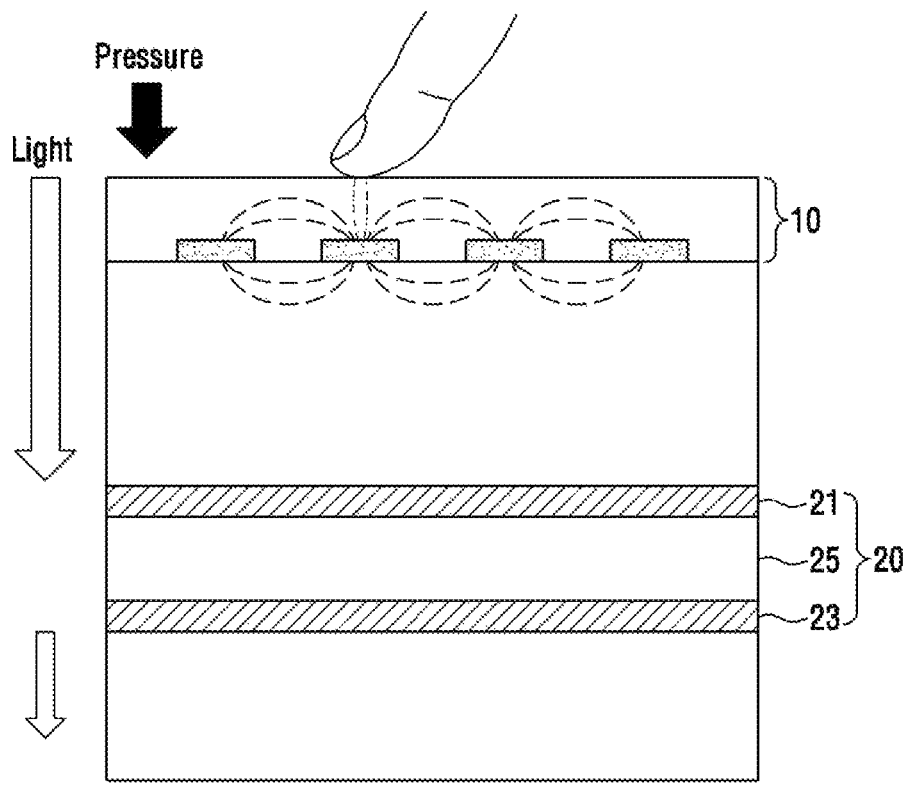
FIG. 1 is a schematic cross sectional view of a conventional mobile device.
Figure 2:
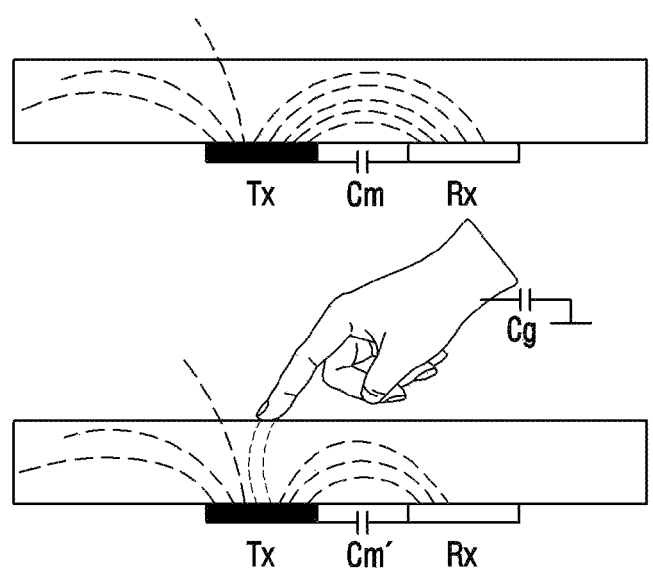
FIG. 2 is a conceptual view showing the operation principle of a conventional touch sensor.
Figure 3:
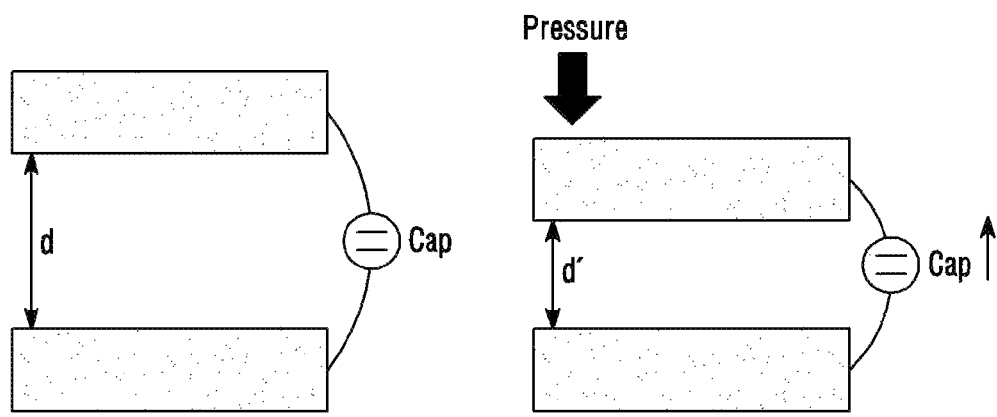
FIG. 3 is a conceptual view showing the operation principle of a conventional force sensor.

As described above, a capacitance (C) with a predetermined value is generated at each crossing of the drive electrode TX and the receiving electrode RX. When an object as a part of human body such as finger or an object like a stylus approaches close to the touch sensor panel 100, the value of the capacitance may be changed. In FIG. 1, the capacitance may represent a mutual capacitance (Cm). The sensing unit 110 senses such electrical characteristics, thereby being able to sense whether the touch has occurred on the touch sensor panel 100 or not and the touch position. For example, the sensing unit 110 is able to sense whether the touch has occurred on the surface of the touch sensor panel 100 comprised of a two-dimensional plane consisting of a first axis and a second axis and/or the touch position.

More specifically, when the touch occurs on the touch sensor panel 100, the drive electrode TX to which the drive signal has been applied is detected, so that the position of the second axial direction of the touch can be detected. Likewise, when the touch occurs on the touch sensor panel 100, a capacitance change is detected from the reception signal received through the receiving electrode RX, so that the position of the first axial direction of the touch can be detected.

The mutual capacitance type touch sensor panel as the touch sensor panel 100 has been described in detail in the foregoing. However, in the touch input device according to the embodiment of the present invention, the touch sensor panel 100 for detecting whether or not the touch has occurred and the touch position may be implemented by using not only the above-described method but also any touch sensing method like a self-capacitance type method, a surface capacitance type method, a projected capacitance type method, a resistance film method, a surface acoustic wave (SAW) method, an infrared method, an optical imaging method, a dispersive signal technology, and an acoustic pulse recognition method, etc.

The display module of the touch input device according to the embodiment of the present invention may be a display panel included in a liquid crystal display (LCD), a plasma display panel (PDP), an organic light emitting diode (OLED), etc. Accordingly, a user may perform the input operation by touching the touch surface while visually identifying an image displayed on the display panel.

Here, the display module may include a control circuit which receives an input from an application processor (AP) or a central processing unit (CPU) on a main board for the operation of the touch input device and displays the contents that the user wants on the display panel.

Here, the control circuit for the operation of the display panel may include a display panel control IC, a graphic controller IC, and a circuit required to operate other display panels.

Figure 5:
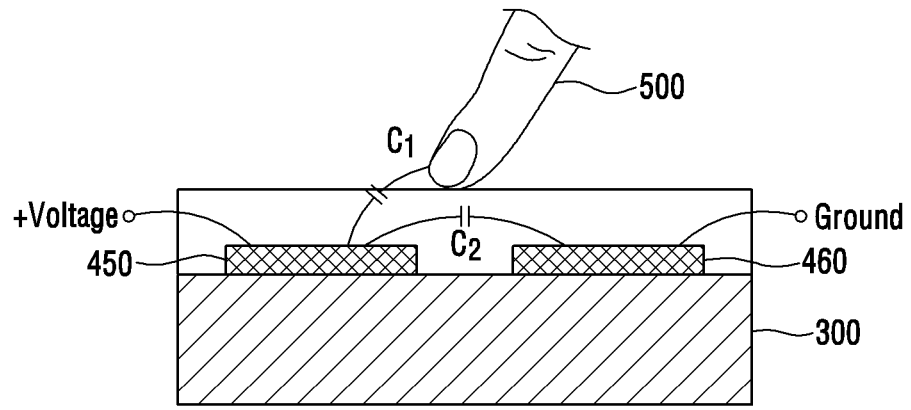
FIG. 5 is a view for describing problems of a conventional touch input device.
Figure 6:
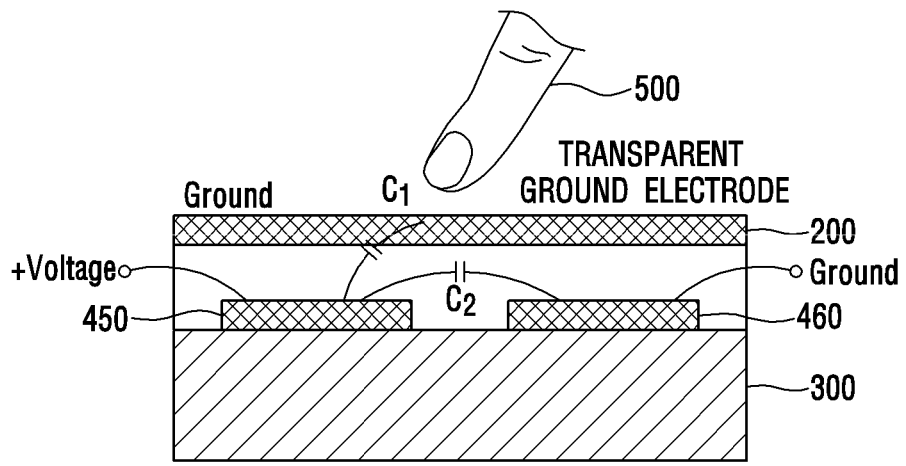
FIG. 6 is a cross sectional view for describing the configuration and operation of a touch input device according to an embodiment of the present invention.

FIG. 5 is a view for describing problems of a conventional touch input device. FIG. 6 is a cross sectional view for describing the configuration and operation of a touch input device according to an embodiment of the present invention.

Referring to FIG. 5, in the conventional touch input device, a first electrode 450 and a second electrode 460 may operate as a pressure sensor. Here, a capacitance C2 between the first electrode 450 and the second electrode 460 decreases due to the touch by an object 500. Therefore, it is not possible to reliably detect the position of the touch and the magnitude of the pressure by the object 500 by using the first electrode 450 and the second electrode 460.

Particularly, when it is intended to improve the sensitivity in detecting the magnitude of the pressure by disposing the first electrode 450 and the second electrode 460 on the top surface of the display module 300 (that is, at the uppermost portion of the display device), a sensor for detecting the position of the touch and a sensor for detecting the pressure magnitude must be separately provided.

However, referring to FIG. 6, a transparent ground electrode 200 is formed over the first electrode 450 and the second electrode 460 in accordance with embodiment of the present invention, Then, value of a base capacitance C1 between the first electrode 450 and transparent ground electrode 200 is fixed and is not changed even if a touch occurs by the object 500. Therefore, the magnitude of the touch pressure can be reliably detected by the change amount of the capacitance C2 between the first electrode 450 and the second electrode 460. In addition to this, the touch position where the touch of the object 500 has occurred can also be detected based on the change of the capacitance C2.

Therefore, according to the embodiment of the present invention, the sensitivity is improved in detecting the magnitude of the pressure by disposing the first electrode 450 and the second electrode 460 on the top surface of the display module 300 (that is, at the uppermost portion of the display device), the value of the base capacitance C1 between the transparent ground electrode 200 and the first electrode 450 is fixed by the transparent ground electrode 200, so that the change of the base capacitance C1 by the touch of the object 500 can be removed. Accordingly, the magnitude of the touch pressure can be reliably detected based on the change amount of the capacitance C2 between the first electrode 450 and the second electrode 460. In conclusion, according to the embodiment of the present invention, a force touch sensor can be implemented by using a single kind of sensor.

The uppermost transparent ground electrode 200 may be formed of a transparent conductive material (for example, indium tin oxide (ITO) or antimony tin oxide (ATO) which is made of $SnO_2$ and $In_2O_3$, etc).

Figure 7:
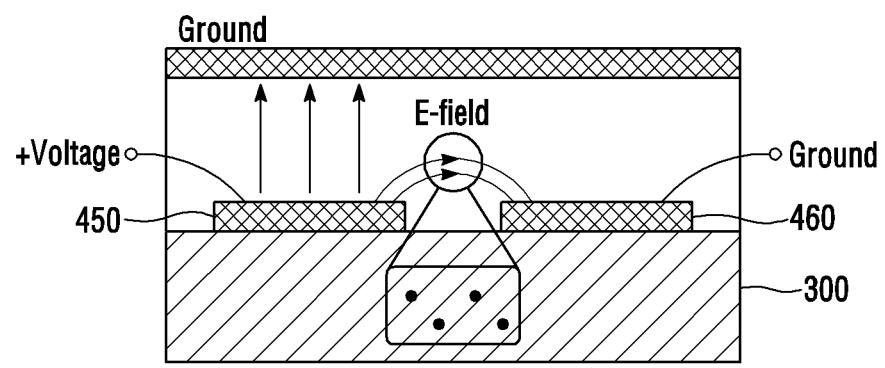
FIGS. 7 to 9 are views for describing the operation of a touch input device according to another embodiment of the present invention.
Figure 8:
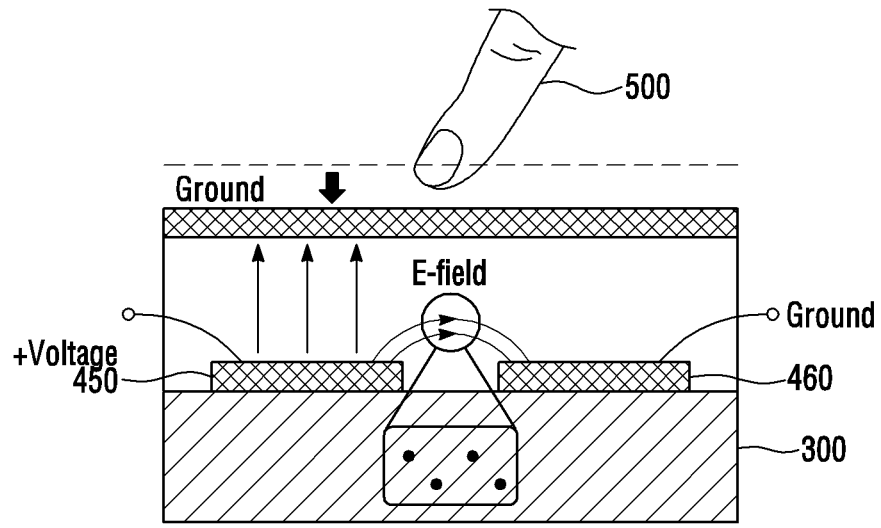
Figure 9:
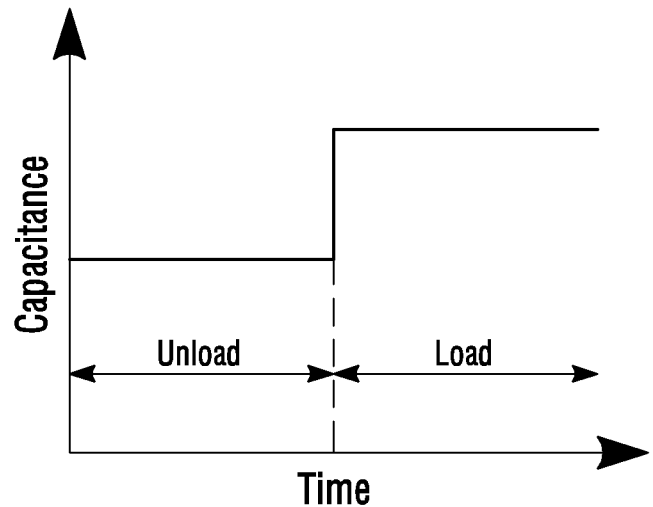
Figure 10:
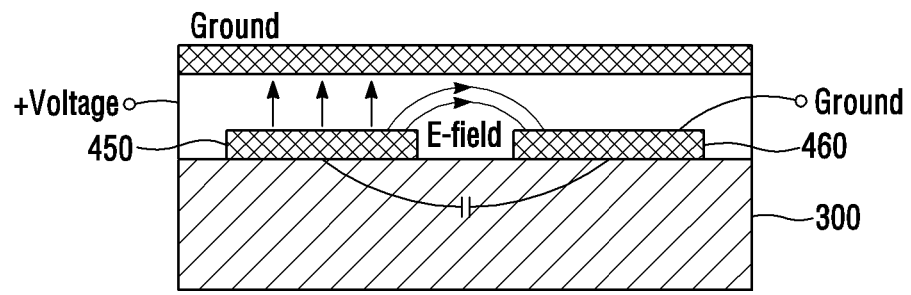
FIGS. 10 to 12 are views for describing the operation of the touch input device according to another embodiment of the present invention.
Figure 11:
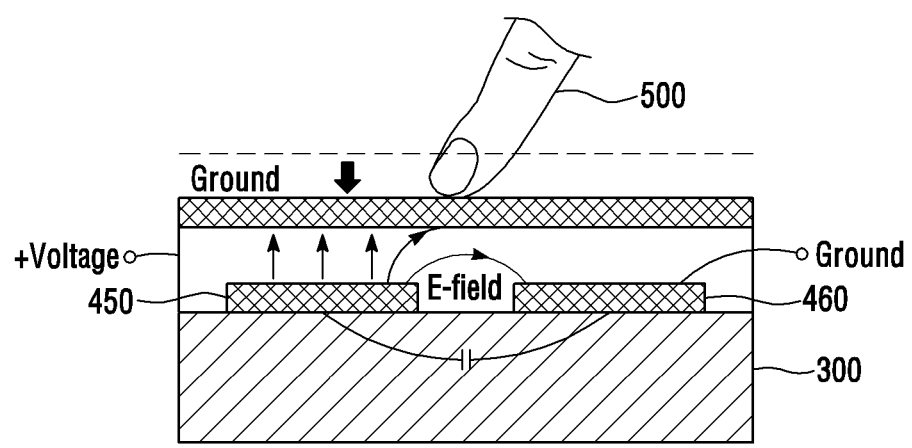
Figure 12:
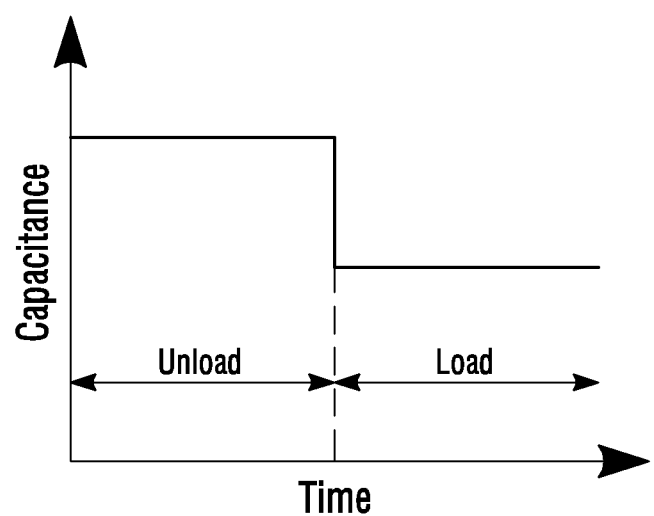

FIGS. 7 to 9 are views for describing the operation of the touch input device according to the embodiment of the present invention. FIGS. 10 to 12 are views for describing the operation of the touch input device according to another embodiment of the present invention.

Referring to FIGS. 7 to 12, according to the embodiment of the present invention, the change of the capacitance C2 between the first electrode 450 and the second electrode 460 when the transparent ground electrode 200 is disposed will be described.

(1) First, when the transparent ground electrode 200 is disposed at a height equal to or greater than the height at which an electric field (E-field) region is formed between the first electrode 450 and the second electrode 460 (see FIG. 6), the influence of the touch of the object 500 on the electric field region can be removed by the transparent ground electrode 200. However, since the transparent ground electrode 200 is disposed at a height equal to or greater than the height at which the electric field region is formed, the electric field region formed between the first electrode 450 and the second electrode 460 is not affected even though the pressure of the object 500 is applied to the top of the transparent ground electrode 200. Therefore, in this case, the capacitance C2 is increased by the increase of a dielectric constant according to the pressure between the first electrode 450 and the second electrode 460 by the pressure of the object 500 (see the Load state in FIG. 9).

(2) secondly, when the transparent ground electrode 200 is disposed at a height less than the height at which the electric field region is formed between the first electrode 450 and the second electrode 460 (see FIG. 10), the influence of the touch of the object 500 on the electric field region can be removed by the transparent ground electrode 200. However, since the transparent ground electrode 200 is disposed at a height less than the height at which the electric field region is formed, when the pressure of the object 500 is applied to the top of the transparent ground electrode 200, the transparent ground electrode 200 serves as ground and absorbs a portion of the electric field region formed between the first electrode 450 and the second electrode 460, so that the electric field region is reduced. Therefore, in this case, the capacitance C2 between the first electrode 450 and the second electrode 460 is also decreased by the pressure of the object 500 (see the Load state in FIG. 12).

Figure 13:
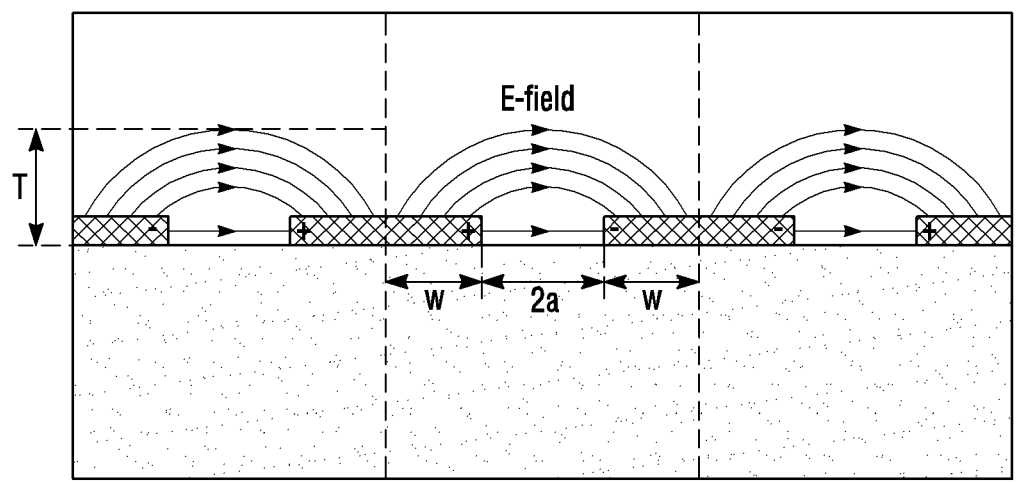
FIG. 13 is a view for describing an electric field (E-field) distribution of the touch input device according to the embodiment of the present invention.
Figure 14:
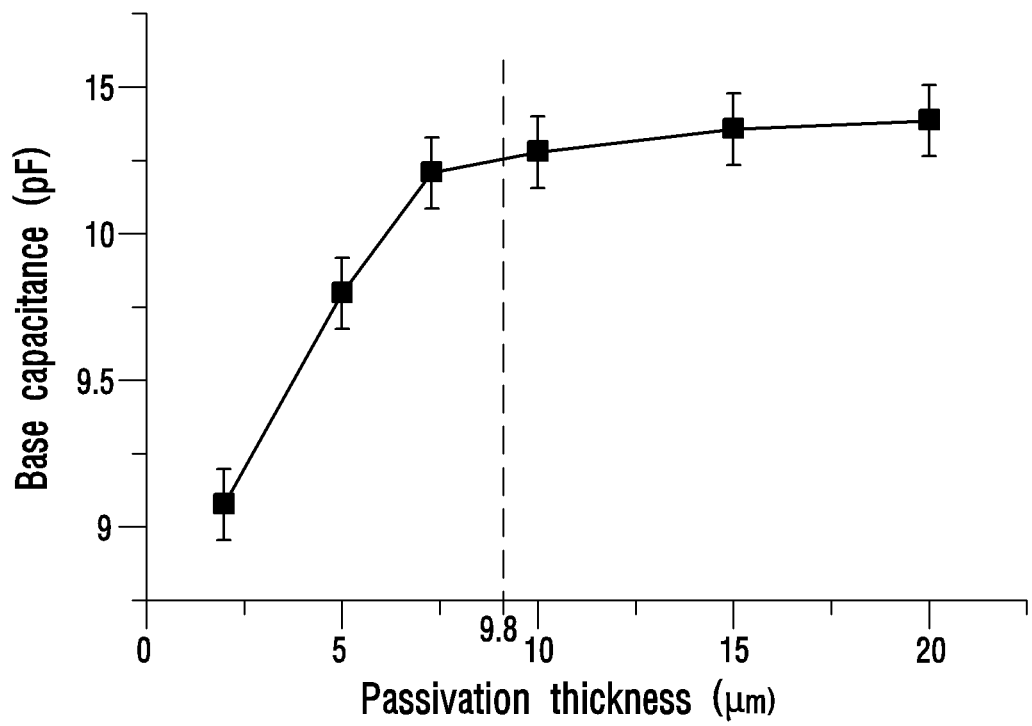
FIG. 14 is a graph showing a base capacitance based on the thickness of a spacer layer of the touch input device according to the embodiment of the present invention.

FIG. 13 is a view for describing the electric field (E-field) distribution of the touch input device according to the embodiment of the present invention. FIG. 14 is a graph showing the base capacitance based on the thickness of a spacer layer of the touch input device according to the embodiment of the present invention.

Referring to FIG. 13, the height T at which the electric field region is formed in the touch input device according to the embodiment of the present invention can be calculated by the following equation (1).

$$\text{Penetration depth } (T) = a\sqrt{\left(1 + \frac{w}{a}\right)^2 - 1} \quad \text{Equation (1)}$$

2a: Electrode gap, 2w: Electrode width

Referring to FIG. 13, when the base capacitance between the first electrode 450 and the second electrode 460 is measured according to the thickness of the spacer layer of the touch input device according to the embodiment of the present invention, the height at which an electric field region is formed between the first electrode 450 and the second electrode 460 can be obtained. Here, when, illustratively, the electrode gap 2a is 20 μm and the electrode width 2w is 8 μm, the height T of the electric field region is about 9.8 μm, which is an experimentally measured result. When the electrode gap 2a and the electrode width 2w are changed, the height T of the electric field region is changed. The height (T) of the electric field region is a height distinguishing between the cases (1) and (2) described with reference to FIGS. 7 to 12.

In the touch input device 1000 according to the embodiment of the present invention, the transparent ground electrode 200 may be bent by the applied pressure of the touch. The transparent ground electrode 200 may be bent in such a manner as to show the biggest transformation at the touch position. When the transparent ground electrode 200 is bent according to the embodiment, a position showing the biggest transformation may not match the touch position. However, the transparent ground electrode 200 may be shown to be bent at least at the touch position. For example, when the touch position approaches close to the border, edge, etc., of the transparent ground electrode 200, the most bent position of the transparent ground electrode 200 may not match the touch position. However, the transparent ground electrode 200 may be shown to be bent at least at the touch position.

Although the first electrode 450 and the second electrode 460 are shown as being formed on the same layer in the above description, the first electrode 450 and the second electrode 460 can be formed on different layers in accordance with the embodiment.

As described above, the touch input device 1000 according to the embodiment of the present invention detects the capacitance change occurring between the first and second electrodes 450 and 460. Therefore, the drive signal needs to be applied to the drive electrode among the first electrode 450 and the second electrode 460, and the sensing signal is obtained from the receiving electrode and then the touch pressure must be calculated from the change amount of the capacitance. According to the embodiment, it is possible to further include a touch sensing IC for the operation of a pressure detection module.

Figure 15:
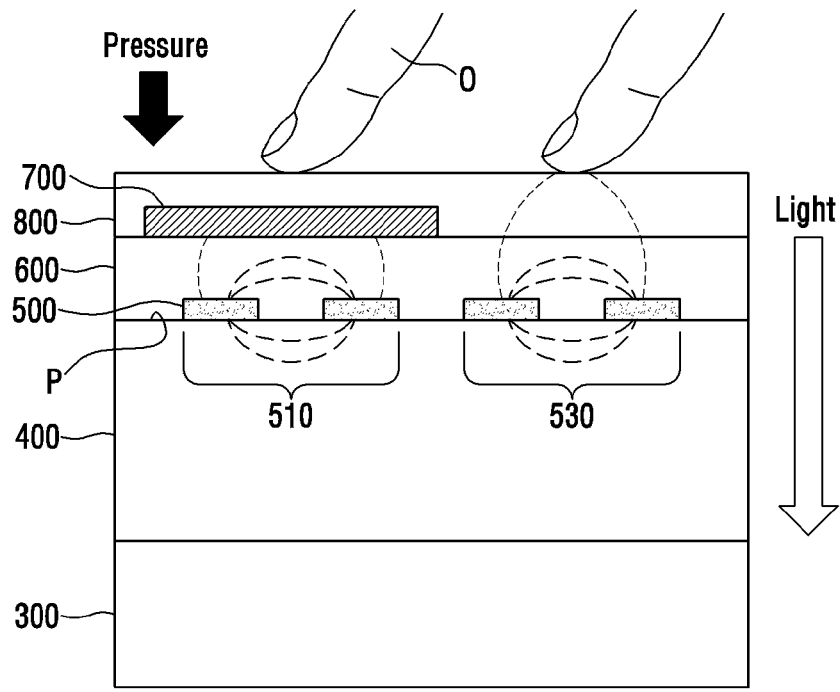
FIG. 15 is a schematic cross-sectional view of a touch input device according to another embodiment.

FIG. 15 is a schematic cross-sectional view of a touch input device according to another embodiment.

Referring to FIG. 15, the touch input device according to the embodiment includes a plurality of sensors 500, an insulating layer 600, and a ground layer 700. Here, the touch input device according to the embodiment may further include a cover layer 800, a base layer 400, and the display module 300.

The plurality of sensors 500 are disposed on a predetermined plane P located within the touch input device according to the embodiment. Here, the plane P may be the top surface of the base layer 400 as shown in FIG. 15. Though not shown, the plane P may be the top surface of the display module 300 if the base layer 400 does not exist.

The plurality of sensors 500 include a drive sensor to which a drive signal is input and a sensing sensor to which a sensing signal is output. Here, the drive sensor may be the drive electrode, and the sensing sensor may be a sensing electrode.

The ground layer 700 is disposed on the plurality of sensors 500. The ground layer 700 may be disposed on some sensors 510 of the plurality of sensors 500. Here, some sensors 510 may include a drive sensor to which a drive signal is input and a sensing electrode to which a sensing signal is output. By means of some sensors 510, the ground layer 700, and the insulating layer 600 disposed between some sensors 510 and the ground layer 700, the touch input device according to the embodiment can detect the magnitude of the pressure of the touch which is input by an object O. The principle of detecting the magnitude of the pressure will be described later with reference to the accompanying drawings.

Meanwhile, by remaining sensors 530, the touch input device according to the embodiment can detect the position of the touch which is input by the object O. The principle of detecting the position of the touch will be also described later with reference to the accompanying drawings.

The ground layer 700 is spaced apart from the plurality of sensors 500 by a predetermined gap. The ground layer 700 and the plurality of sensors 500 may be spaced apart from each other by a predetermined gap by the insulating layer 600.

The ground layer 700 has a ground potential.

The ground layer 700 is disposed on some sensors 510 of the plurality of sensors 500.

The ground layer 700 may be disposed on the top surface of the insulating layer 600 and is not limited thereto. The ground layer 700 may be disposed within the insulating layer 600. When the insulating layer 600 is composed of a plurality of insulating layers, the ground layer 700 may be disposed on the bottom surface of the intermediate insulating layer.

The cover layer 800 is disposed on the ground layer 700. The ground layer 700 may be disposed on the bottom surface of the cover layer 800 or may be disposed within the cover layer 800 or may be disposed on the top surface of the cover layer 800.

The ground layer 700, together with some sensors 510 disposed under the ground layer 700, can be used as a force sensor for detecting the magnitude of the pressure of the touch. Furthermore, the ground layer 700 can function to block the electric field loss due to the object O during the process in which the touch input device according to the embodiment of the present invention measures the magnitude of the pressure of the touch.

The insulating layer 600 is disposed between the ground layer 700 and the plurality of sensors 500. The insulating layer 600 is disposed on the plane P. The insulating layer 600 may be disposed to cover the plurality of sensors 500. The ground layer 700 is disposed on the insulating layer 600.

The insulating layer 600 is made of an elastic material of which thickness is reduced by an external force applied thereto and the thickness is restored to its original state when the external force is removed. Thus, the insulating layer 600 may be also referred to as a cushion layer.

When the object O presses the cover layer 800 over the ground layer 700, the cover layer 800 is bent. Then, by bending of the cover layer 800, the entire ground layer 700 may move down, or a portion of the ground layer 700 may be bent downwardly. The movement and bending of the ground layer 700 act on the insulating layer 600 as an external force and the shape of the insulating layer 600 is changed in response to the external force.

In order to block the electrical connection between the ground layer 700 and the plurality of sensors 500, the insulating layer 600 may be composed of an insulating material.

The insulating layer 600 may include nanoparticles. The insulating layer 600 may be formed by injecting nanoparticles (hereinafter, referred to as nanomaterial) into a base material composed of an elastic material. The nanoparticle may be a metallic material and is not limited thereto.

Here, the insulating layer 600 including the nanoparticles may be referred to as a dielectric layer. When an external force is applied to the insulating layer 600, the insulating layer 600 is compressed. Therefore, the number of the nanoparticles per unit area or per unit volume within the insulating layer 600 is increased. This increases the dielectric constant of the insulating layer 600. As the dielectric constant is increased, the capacitance between the adjacent drive and receiving sensors among the plurality of sensors 500 is increased. As the magnitude of the external force applied to the insulating layer 600 increases, the capacitance between the adjacent drive and receiving sensors among the plurality of sensors 500 is also increased.

The cover layer 800 is disposed on the insulating layer 600 and the ground layer 700. The cover layer 800 may be made of glass or plastic material. The cover layer 800 may be made of a transparent or translucent material, and is not limited thereto. The cover layer 800 may be made of an opaque material.

The object O is input to the top surface of the cover layer 800. When the object O touches the top surface of the cover layer 800 with a predetermined pressure, the cover layer 800 may be bent by the pressure.

The bending of the cover layer 800 causes deformation of the ground layer 700. A portion of the ground layer 700 may be bent, or the entire ground layer 700 may move downward. The bending or movement of the ground layer 700 causes deformation of the insulating layer 600. The insulating layer 600 is deformed so as to correspond to the deformation (bending or movement) of the ground layer 700. The change of the distance between the ground layer 700 and some sensors 510 changes the capacitance value between some sensors 510. The change of the capacitance value can be detected through the change of the electrical characteristic value which is output from the receiving sensor among some sensors 510.

Though separate drawings are not shown, additional layers may be further disposed between the cover layer 800 and the ground layer 700.

The base layer 400 provides the plane P on which the plurality of sensors 500 are disposed. The top surface of the base layer 400 may be the plane P. Though not shown in a separate drawing, the plane P may be the bottom surface of the base layer 400 or may be included within the base layer 400.

The base layer 400 may be composed of an insulating material. This intends to block the electrical connection between the plurality of sensors 500.

The base layer 400 may be made of a solid, inelastic material. However, the base layer 400 is not limited thereto. The base layer 400 may be made of a material having a relatively lower modulus of elasticity than that of the insulating layer 600.

The base layer 400 may not be an essential component in the touch input device according to the embodiment. The plurality of sensors 500 may be disposed on the top surface of the display module 300 without the base layer 400.

The top surface of the base layer 400 may have a nano embossing structure. For example, as shown in FIG. 10, the top surface of the base layer 400 may have a nano embossing structure, and the plurality of sensors 500 may be arranged along the nano embossing structure. The entire top surface of the base layer 400 may have the nano embossing structure, and the nano embossing structure may be formed only in a specific portion of the top surface of the base layer 400.

When the top surface of the base layer 400 has the nano embossing structure, stress concentration can occur, so that the touch or pressure sensing sensitivity can be further improved.

The display module 300 is disposed under the plurality of sensors 500. The display module 300 may be disposed under the base layer 400.

The plane P, the plurality of sensors 500, the insulating layer 600, and the ground layer 700 are disposed on the display module 300.

The display module 300 may be a display panel included in a liquid crystal display (LCD), a plasma display panel (PDP), an organic light emitting diode (OLED), etc.

Figure 16:
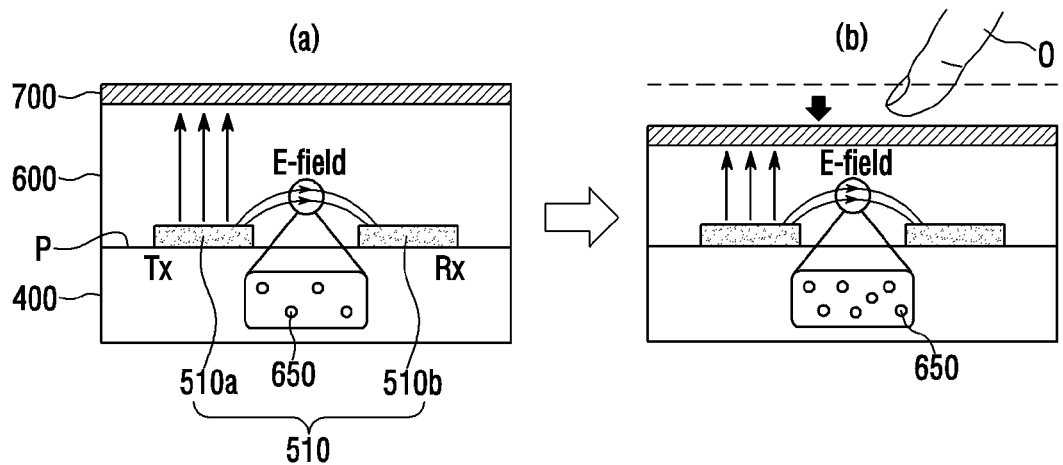
FIG. 16 is a conceptual cross-sectional view for describing the operation principle of the touch input device according to another embodiment shown in FIG. 15.

FIG. 16 is a conceptual cross-sectional view for describing the operation principle of the touch input device according to another embodiment shown in FIG. 15.

A principle in which some sensors 510, the insulating layer 600, and the ground layer 700 shown in FIG. 15 operate as the force sensor is described in (a) to (b) of FIG. 16. A case where an external force by the object O is not applied to the ground layer 700 is shown in (a), and a case where the external force by the object O is applied to the ground layer 700 is shown in (b). Here, the insulating layer 600 includes nanoparticles 650.

Referring to (a) to (b) of FIG. 16, since the insulating layer 600 is made of an elastic material, the ground layer 700 is pressed down by the pressure of the object O. When the ground layer 700 is pressed down, the thickness of the insulating layer 600 is reduced. When the thickness of the insulating layer 600 is reduced, the distance between the ground layer 700 and some sensors 510 is reduced and the total volume of the insulating layer 600 is reduced, so that the number of the nanoparticles 650 per unit volume is increased. Therefore, since the dielectric constant of the insulating layer 600 is increased, and due to the increase of the dielectric constant, the capacitance value between the drive sensor 510a and the sensing sensor 510b is changed to increase. The sensing sensor 510b outputs an electrical characteristic value, for example, a voltage value, corresponding to the changed capacitance value. The touch input device according to the embodiment can detect the magnitude of the pressure from the output electrical characteristic value.

Figure 17:
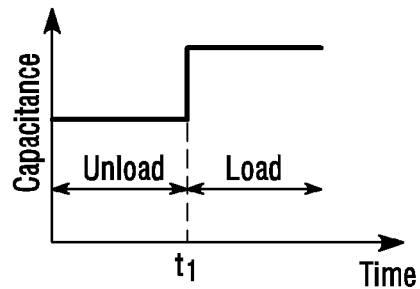
FIG. 17 is a graph for conceptually describing the change of the capacitance value depending on time in (a) to (b) of FIG. 16.

FIG. 17 is a graph for conceptually describing the change of the capacitance value depending on time in (a) to (b) of FIG. 16.

As shown in FIG. 17, it can be seen that the capacitance value between the drive sensor 510a and the sensing sensor 510b is increased based on a predetermined time point t1 at which the pressure by the object O is input.

While a case where the insulating layer 600 includes the nanoparticles 650 is shown in FIG. 17 and (a) to (b) of FIG. 16, an operation principle of a case where the insulating layer 600 does not include the nanoparticles 650 will be described.

Since the insulating layer 600 is made of an elastic material, the ground layer 700 is pressed down by the pressure of the object O. When the ground layer 700 is pressed down, the thickness of the insulating layer 600 is reduced and the distance between the ground layer 700 and some sensors 510 is reduced. Accordingly, the capacitance value between the drive sensor 510a and the sensing sensor 510b is changed to increase. The sensing sensor 510b outputs an electrical characteristic value, for example, a voltage value, corresponding to the changed capacitance value, and can detect the magnitude of the pressure from the output electrical characteristic value.

Figure 18:
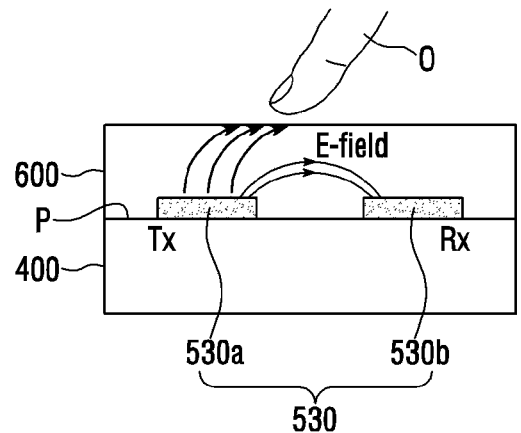
FIG. 18 is a conceptual cross-sectional view for describing the operation principle of the touch input device according to another embodiment shown in FIG. 15.

FIG. 18 is a conceptual cross-sectional view for describing the operation principle of the touch input device according to another embodiment shown in FIG. 15.

FIG. 18 is a view for describing a principle in which the remaining sensors 530 shown in FIG. 15 operate as a touch sensor. FIG. 18 shows that the object O approaches close to the remaining sensors 530. Here, the insulating layer 600 may or may not include the nanoparticle 650.

When the object O approaches close to the remaining sensors 530, the capacitance between the drive sensor 510a and the sensing sensor 510b is reduced because the object O absorbs the electric field.

The electric field (E-field) generated between the remaining sensors 530 is mainly concentrated among the remaining sensors 530. Therefore, even though the electric field (E-field) existing outside the remaining sensors 530 is lost by the ground layer 700, the sensitivity may not be significantly reduced.

Figure 19:
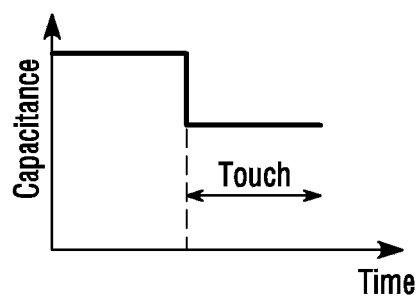
FIG. 19 is a graph for conceptually describing the change of the capacitance value depending on time in FIG. 18.

FIG. 19 is a graph for conceptually describing the change of the capacitance value depending on time in FIG. 18.

As shown in FIG. 19, it can be seen that the capacitance value between the drive sensor 510a and the sensing sensor 510b is reduced based on the predetermined time point t1 at which the object O approaches.

Figure 20:
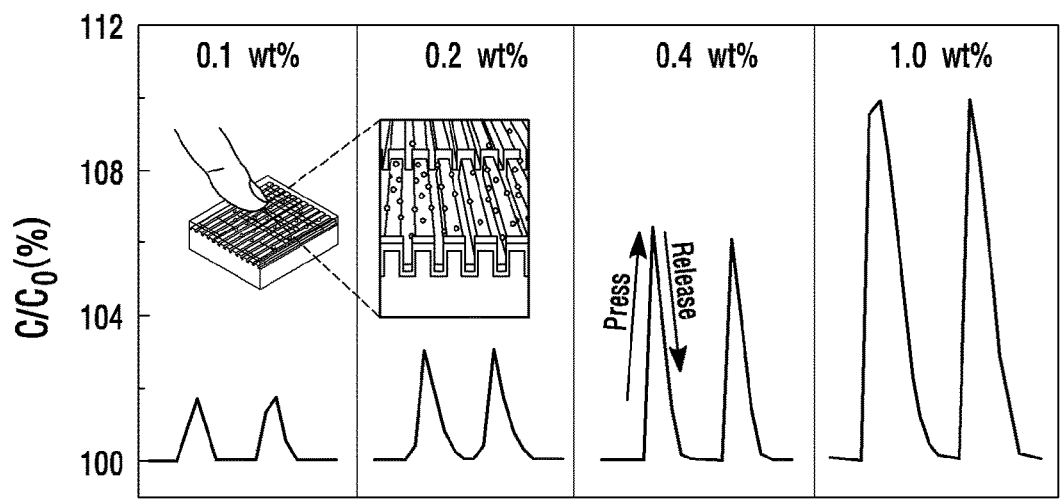
FIG. 20 is a graph showing results of an experiment showing the change of pressure sensitivity according to a weight ratio (wt %) of the nanoparticle when the insulating layer 600 of the touch input device according to the embodiment shown in FIG. 15 includes the nanoparticle.

FIG. 20 is a graph showing results of an experiment showing the change of pressure sensitivity according to a weight ratio (wt %) of the nanoparticle when the insulating layer 600 of the touch input device according to the embodiment shown in FIG. 15 includes the nanoparticle.

Referring to FIG. 20, as the weight ratio (wt %) of the nanoparticles included within the insulating layer 600 increases, the density change of the nanoparticles by the pressure increases, so that it can be seen that the change rate (or pressure sensitivity) of the capacitance is increased.

Figure 21:
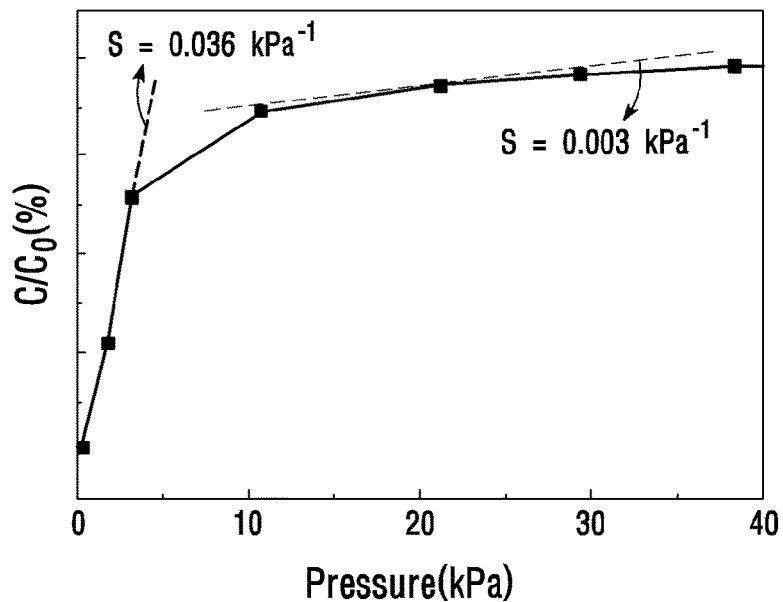
FIG. 21 is a graph showing results of an experiment showing the change of pressure sensitivity according to the magnitude of the pressure applied to the touch input device according to the embodiment shown in FIG. 15.

FIG. 21 is a graph showing results of an experiment showing the change of pressure sensitivity according to the magnitude of the pressure applied to the touch input device according to the embodiment shown in FIG. 15.

Referring to FIG. 21, since the volume of the insulating layer 600 is reduced with the increase of the pressure, the number of the nanoparticles per unit volume is increased, which also increases the dielectric constant. Therefore, it can be seen that the rate of change of capacitance is also increased.

While FIG. 21 is a graph showing results of the experiment when the insulating layer 600 includes the nanoparticles, it is expected that similar experimental results is obtained even if the insulating layer 600 does not include the nanoparticles.

Figure 22:
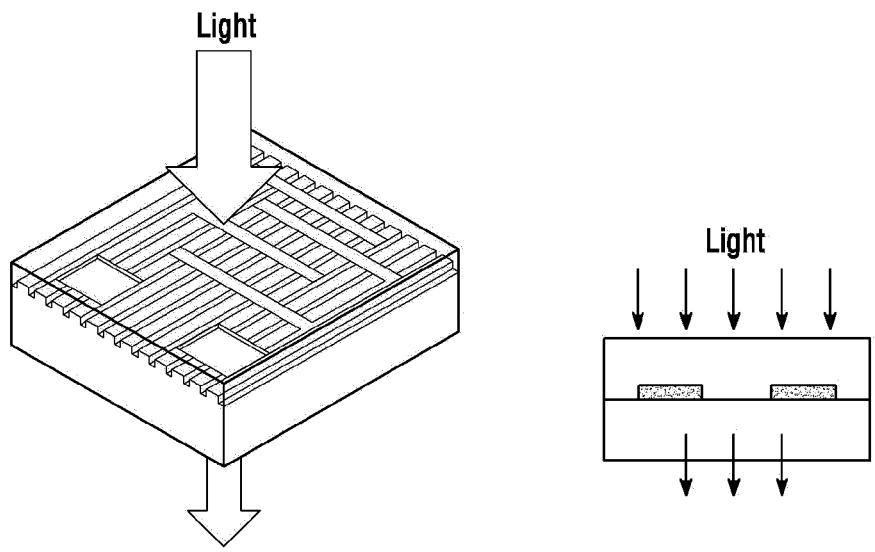
FIG. 22 is a view experimentally showing that, as with the touch input device according to the embodiment shown in FIG. 15, the light transmittance can be improved even when the plurality of sensors are arranged on the same plane.
Figure 23:
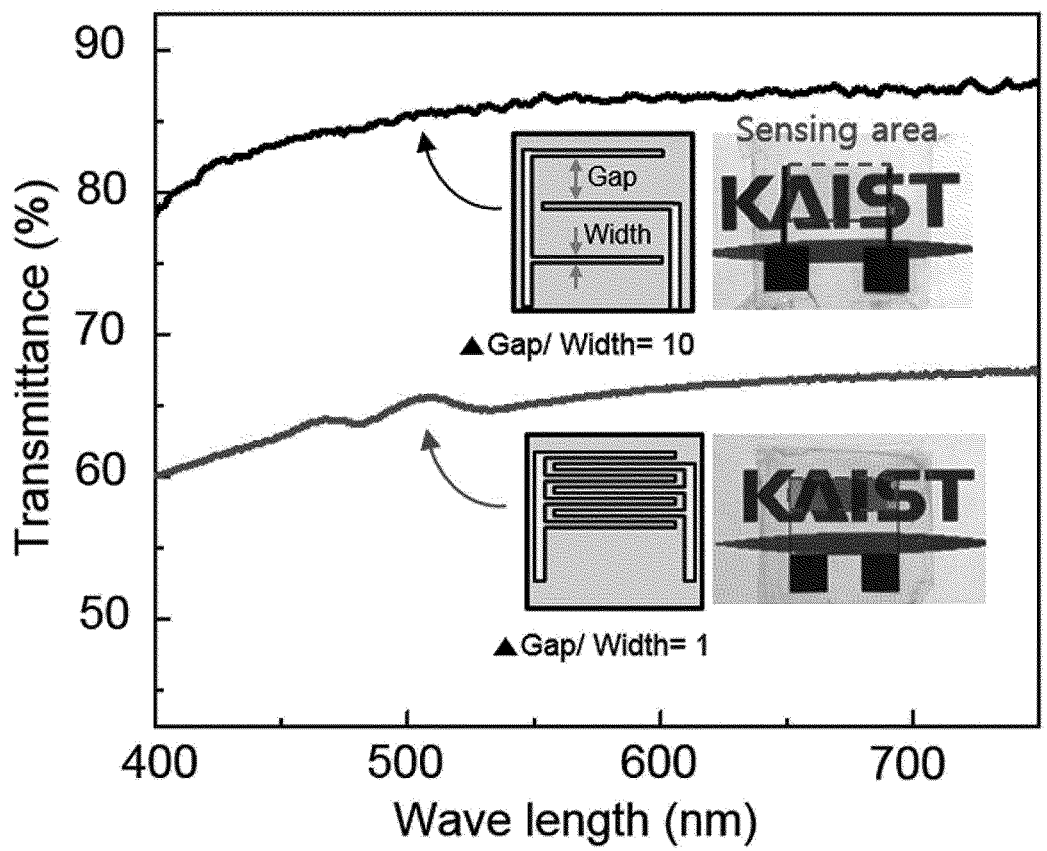
FIG. 23 is a graph obtained through an experiment showing that the light transmittance is changed according to the gap between the plurality of sensors.

FIG. 22 is a view experimentally showing that, as with the touch input device according to the embodiment shown in FIG. 15, the light transmittance can be improved even when the plurality of sensors are arranged on the same plane. FIG. 23 is a graph obtained through an experiment showing that the transmittance is changed according to the gap between the plurality of sensors.

Referring to FIGS. 22 to 23, when the plurality of sensors are arranged on the same plane, unlike the conventional method of arranging the sensors in the vertical direction, a high transmittance can be maintained by widening the gap between the plurality of sensors. Also, the transmittance can be maintained even by using a metal electrode instead of an oxide such as ITO, so that this is mechanically stable and economical. Here, if the ratio of the gap between the plurality of sensors, based on the width of the sensor is equal to or greater than 10, it can be found that 80% or more of light with a wavelength of 400 nm or more is transmitted.

Figure 24:
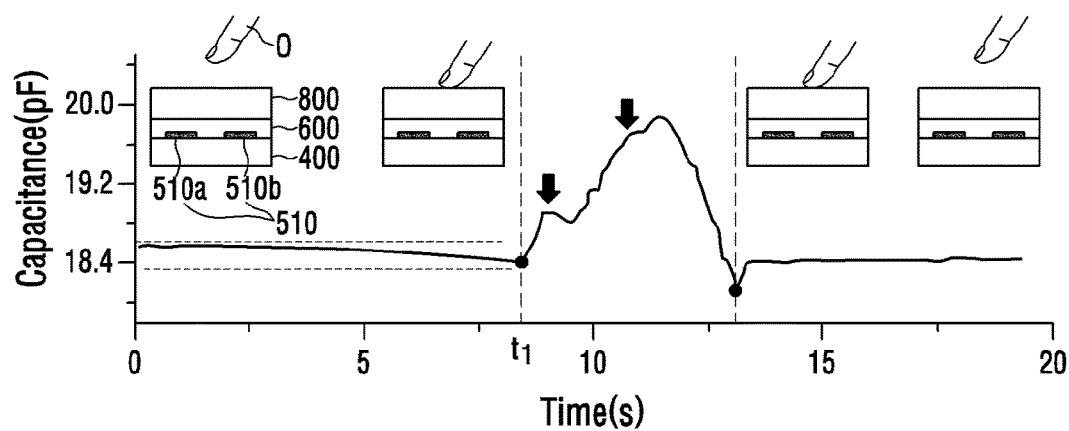
FIGS. 24 to 25 are comparison graphs for describing a shielding effect of the ground layer 700 of the touch input device according to another embodiment shown in FIG. 15.
Figure 25:
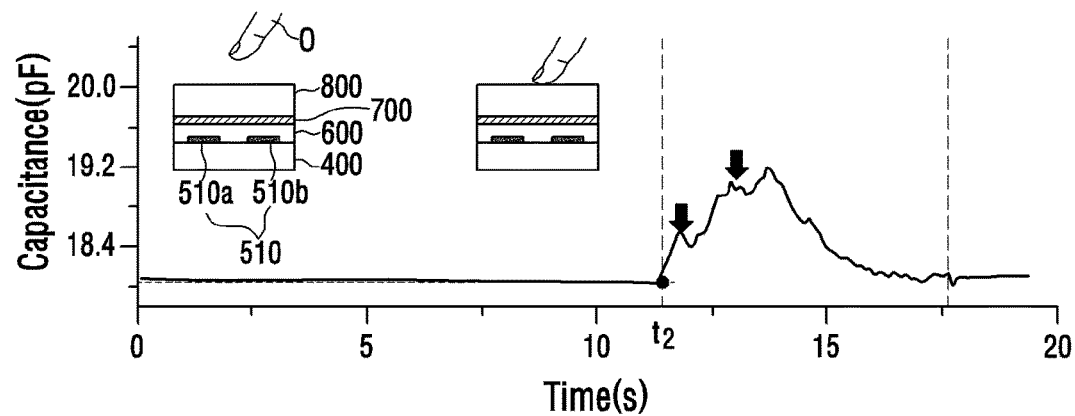

FIGS. 24 to 25 are comparison graphs for describing a shielding effect of the ground layer 700 of the touch input device according to another embodiment shown in FIG. 15.

FIG. 24 is an experimental graph showing a case where there is no ground layer 700 in the touch input device according to the embodiment shown in FIG. 15. It can be seen that, due to the electric field (E-field) loss by the object O, the capacitance between the drive sensor 510a and the sensing sensor 510b is reduced during a time period (0~t1) from when the object O approaches close to the cover layer 800 to when the object O touches the cover layer 800.

FIG. 25 is an experimental graph showing a case where the ground layer 700 is included in the touch input device according to the embodiment shown in FIG. 15. Since the electric field (E-field) loss by the object O is almost blocked by the ground layer 700, it can be seen that the capacitance between the drive sensor 510a and the sensing sensor 510b is almost unchanged during a time period (0~t2) from when the object O approaches close to the cover layer 800 to when the object O touches the cover layer 800. This proves that the ground layer 700 blocks almost the electric field loss by the object O while detecting the magnitude of the pressure.

A modified example of the plurality of sensors 500 and the ground layer 700 of the touch input device according to another embodiment shown in FIG. 15 will be described with reference to (a) to (b) of FIG. 26. A plan view is shown in (a) of FIG. 26, and a cross-sectional view taken along line A-A' of (a) of FIG. 26 is shown in (b) of FIG. 26.

Figure 26:
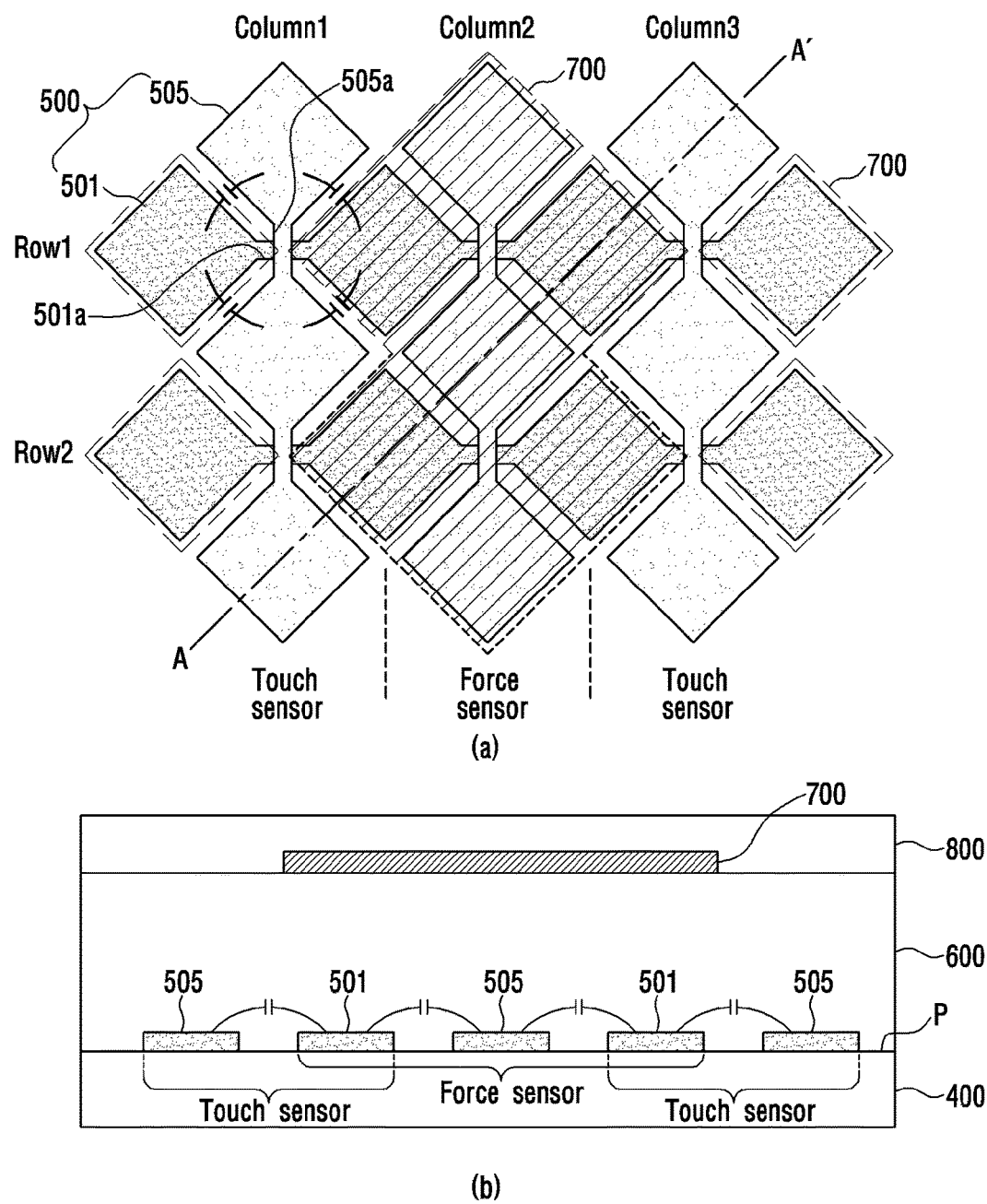
FIG. 26 is a view showing in (a) to (b) thereof a modified example of the plurality of sensors 500 and the ground layer 700 of the touch input device according to another embodiment shown in FIG. 15.

Referring to (a) to (b) of FIG. 26, the plurality of sensors 500 are spaced apart from each other by a predetermined distance. The plurality of sensors 500 are arranged in a plurality of row directions and in a plurality of column directions.

The plurality of sensors 500 may include sensors 501 arranged in a plurality of row directions Row1 and Row2 and sensors 505 arranged in a plurality of column directions Column1, Column2, and Column3.

The sensors 501 arranged along one row are electrically connected to each other, and the sensors 505 arranged along one column are also electrically connected to each other. The sensors 501 arranged along one column are not electrically connected to the sensors 505 arranged along one row.

Connection portions 501a and 505a are formed between the two adjacent sensors 501 among the sensors 501 arranged along the row and between the two adjacent sensors 505 among the sensors 505 arranged along the column. The connection portions 501a arranged along the row must not be electrically connected to the connection portions 505a arranged along the column. Therefore, at the crossing of the connection portion 501a arranged along the row and the connection portion 505a arranged along the column, the connection portion 501a arranged along the row may be arranged on the connection portion 505a arranged along the column, and an insulating layer composed of an insulating material may be formed between the connection portion 501a arranged along the row and the connection portion 505a arranged along the column. Further, the connection portion 505a arranged along the column may be arranged on the connection portion 501a arranged along the row, the insulating layer composed of an insulating material may be formed between the connection portion 501a arranged along the row and the connection portion 505a arranged along the column.

The sensors 501 arranged in a plurality of row directions may be drive sensors (or drive electrodes) to which the drive signal is input, and the sensors 505 arranged in a plurality of column directions may be sensing sensors (or sensing electrodes) to which the sensing signal is output, and vice versa. That is, the sensors 501 arranged in a plurality of row directions may be sensing sensors (or sensing electrodes) to which the sensing signal is output, and the sensors 505 arranged in a plurality of column directions may be drive sensors (or drive electrodes) to which the drive signal is input.

The sensors arranged under the ground layer 700 among the sensors 505 arranged in a plurality of column directions may be pressure sensing sensors which output a pressure sensing signal for detecting the magnitude of the pressure. The sensors which are not arranged under the ground layer 700 among the sensors 505 arranged in a plurality of column directions may be touch sensing sensors which output a touch sensing signal for detecting the position of the touch.

The ground layer 700 may be arranged on the sensors 501 arranged in a plurality of row directions. The sensors 501 arranged in a plurality of row directions may be pressure drive sensor to which a pressure drive signal for detecting the magnitude of the pressure is input or touch drive sensors to which a touch drive signal for detecting the position of the pressure is input. That is, the sensors 501 arranged in a plurality of row directions can be used as the touch drive sensor as well as the pressure drive sensor.

Each of the sensors 501 and 505 may have a hexahedral structure having a quadrangular top surface or a quadrangular bottom surface. Two mutually facing edges of the sensors 501 and 505 are arranged in the row direction or in the column direction.

The ground layer 700 may be disposed in one or a plurality of column directions. Here, unlike what is shown in FIG. 26, the ground layer 700 may be arranged in one or a plurality of row directions.

The ground layer 700 may be arranged on the sensors arranged along one column (column 2) among the sensors 505 arranged in a plurality of column directions. Here, the ground layer 700 may be arranged on the sensors arranged along two or more adjacent columns (column 2 and column 3 or column 1 and column 2) among the sensors 505 arranged in a plurality of column directions. Also, the ground layer 700 may be arranged on the sensors arranged along two or more columns (column 1 and column 3) which is not adjacent to each other among the sensors 505 arranged in a plurality of column directions. In this case, two or more ground layer 700 is included. As such, the ground layer 700 may be arranged on the sensors arranged in one or more column directions among the sensors arranged in a plurality of column directions.

The ground layer 700 may be disposed on all or some of the sensors 501 arranged in a plurality of row directions. Here, some of the sensors may be adjacent to the sensors 505 which are arranged under the ground layer 700 and are arranged in one or more column directions.

The ground layer 700 may have, as shown in (a) of FIG. 26, a structure and a size which are enough to cover both the sensors 505 arranged along one or more columns among the sensors 505 arranged in a plurality of column directions and the sensors 501 adjacent to the sensors 505 arranged along one or more columns among the sensors 501 arranged in a plurality of row directions. Also, the ground layer 700 may be, as shown in (a) of FIG. 26, additionally disposed on the sensors 501 arranged in a plurality of row directions.

Referring to (b) of FIG. 26, the plurality of sensors 501 and 505 are disposed on one plane P. The plane P may be the top surface of the base layer 400 and is not limited thereto. The plane P may be the top surface of the display module (not shown). The insulating layer 600 is disposed on the plurality of sensors 501 and 505 and the plane P, and the ground layer 700 is disposed on the insulating layer 600. The cover layer 800 is disposed on the ground layer 700 and the insulating layer 600.

The sensors disposed under the ground layer 700 among the plurality of sensors 501 and 505 may function as the force sensor, and other sensors may function as the touch sensor. The force sensor may include the pressure drive sensor and the pressure sensing sensor, and the touch sensor may include the touch drive sensor and the touch sensing sensor. Here, the pressure drive sensor of the force sensor may be used as the touch drive sensor of the touch sensor. Here, the pressure drive sensor of the force sensor and the touch drive sensor of the touch sensor may be for common use.

Whether the touch occurs or not is determined or the touch position is determined by applying a drive signal to the touch drive sensor and by measuring a capacitance by using by the signal received by the touch sensing sensor. The magnitude of the pressure is determined by applying a drive signal to the pressure drive sensor and by measuring a capacitance by using the signal received by the pressure sensing sensor.

The structures of the plurality of sensors 501 and 505 and the ground layer 700 shown in (a) to (b) of FIG. 26 constitute a high resolution touch/force sensor array and minimize a dead zone.

Figure 27:
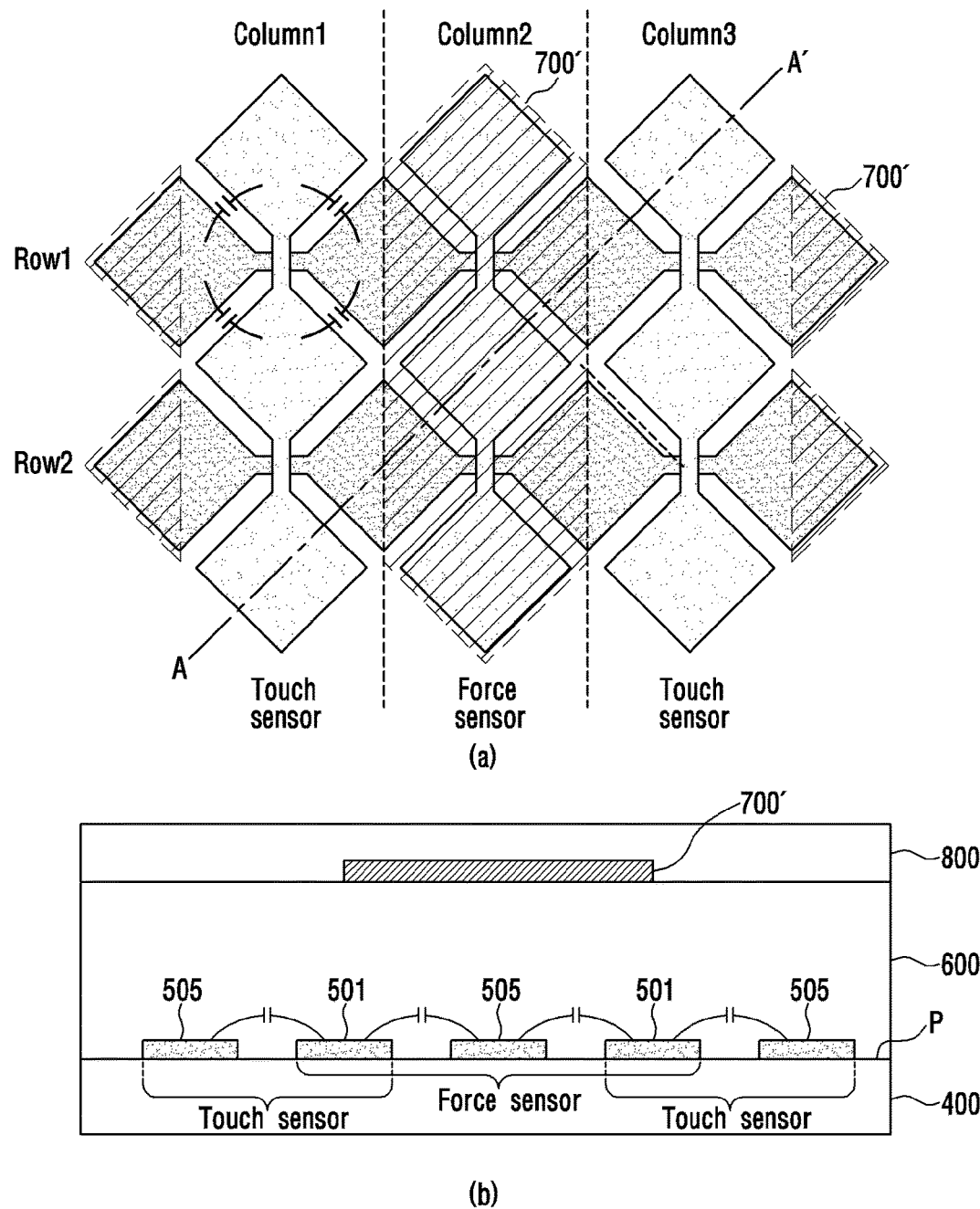
FIG. 27 is a view showing in (a) to (b) thereof another modified example of the plurality of sensors 500 and the ground layer 700 of the touch input device according to another embodiment shown in FIG. 15.

FIG. 27 is a view showing in (a) to (b) thereof another modified example of the plurality of sensors 500 and the ground layer 700 of the touch input device according to another embodiment shown in FIG. 15. A plan view is shown in (a) of FIG. 27, and a cross-sectional view taken along line A-A' of (a) of FIG. 27 is shown in (b) of FIG. 27.

Since the plurality of sensors 500 shown in FIG. 27 are the same as the plurality of sensors 500 shown in FIG. 26, detailed descriptions thereof will be replaced with the foregoing description.

The ground layer 700' shown in FIG. 27 differs in configuration from the ground layer 700 shown in FIG. 26. This will be described below in detail.

Referring to (a) to (b) of FIG. 27, the ground layer 700' is disposed on the sensors arranged in one or more column directions among the sensors 505 arranged in a plurality of column directions The ground layer 700' may be also disposed on some of the sensors 501 arranged in a plurality of row directions. Here, some of the sensors may be adjacent to the sensors arranged in one or more column directions among the sensors 505 arranged in a plurality of column directions. Here, the ground layer 700' may be disposed on a part of some of the sensor 501, not on all of some of the sensor 501.

Since the shape of the ground layer 700' is, as shown in (a) of FIG. 27, simpler than the shape of the ground layer 700 shown in (a) of FIG. 16, the ground layer 700' is easy to form. Also, since the cross sectional area of the ground layer 700' is smaller than the cross sectional area of the ground layer 700 shown in (a) of FIG. 16, the touch sensitivity can be further improved.

The method of detecting the touch position and the magnitude of the pressure of the touch input device shown in FIG. 27 is the same as the method of detecting the touch position and the magnitude of the pressure of the touch input device shown in FIG. 26. Therefore, detailed descriptions thereof will be replaced with the foregoing description.

As shown in FIGS. 15 to 27, the touch input device according to the embodiment can recognize the change of the capacitance value according to the distance change between the ground layer 700 and the sensors 510 disposed under the ground layer 700. Also, by using the insulating layer 600 including the nanoparticles, the touch input device can also recognize the capacitance change between the sensors 510 by the change of the dielectric constant of the insulating layer 600 according to the density change of the nanoparticles.

During the process in which the touch input device according to the embodiment of the present invention detects the magnitude of the pressure, the ground layer 700 blocks the electric field loss due to the object O. Therefore, the increase of the capacitance value by the pressure due to the object O can be reliably measured.

Also, in the touch input device according to the embodiment of the present invention, the remaining sensors 530 without the ground layer 700 thereover measures the reduction of the capacitance value due to the electric field (E-field) loss by the object O, so that it is possible to determine whether the touch occurs or not and the touch position.

Also, in the touch input device according to the embodiment, the ground layer 700 is formed on a conventional touch sensor panel, and thus, the plurality of sensors 500 disposed on the same plane P can be used as the force sensor and the touch sensor. Therefore, a high transmittance can be maintained.

Also, in the touch input device according to the embodiment, the plurality of sensors (or electrodes) are formed on the same plane P, it is possible to increase the aperture ratio of the electrodes compared to the vertical sensors (or electrodes). Therefore, a high transmittance can be maintained even by using a metal material without a transparent oxide such as ITO.

Also, in the touch input device according to the embodiment, the force sensor and the touch sensor are formed on the same plane (P). Accordingly, the number of electrodes through which the light transmits is reduced, and the thickness of the entire sensor including the force sensor and the touch sensor is reduced, so that a high transmittance can be maintained.

Also, in the touch input device according to the embodiment, since the sensors 500 are formed on the same plane P, the thickness of the sensor 500 is made to be thinner than that of a conventional method of forming the sensors in the vertical direction. As a result, it is possible to improve the flexibility and mechanical stability by reducing the stress of the surface caused by bending.

Also, the density of the nanoparticles according to the pressure is greatly changed by using the insulating layer 600 including the nanoparticles, thereby maintaining high pressure detection sensitivity. Therefore, a high sensitivity force sensor can be realized.

Commercially used existing force sensors uses low resolution arrays because they detect the position by the touch sensor and then recognize the pressure. However, since display devices which are used underwater cannot recognize the position through the existing touch sensor, a high resolution force sensor is required to reliably recognize the position and pressure in various environments such as underwater. Unlike an existing force sensor, in the touch input device according to the embodiment, a high resolution force sensor is designed and manufactured. Therefore, the touch input device can reliably recognize the position and the pressure at the same time by using the high resolution force sensor even in external environment such as underwater, so that the touch input device can be applied to various fields of application.

Also, the touch input device according to the embodiment can easily adjust the resolution of the touch sensor and the force sensor by controlling the area of the ground layer 700, thereby improving the linearity of the touch sensing signal.

Also, the touch input device according to the embodiment can be implemented simply by depositing the insulating layer 600 and the ground layer 700 in the conventional touch sensor structure. The process of the touch input device according to the embodiment is not much different from the process used in the existing industry. Therefore, the touch input device according to the embodiment has wide applicability and high marketability.

The touch input device according to another embodiment of the present invention is applicable not only to a mobile device but also to various applications such as a robot, a wearable sensor, and a biosensor that are used together with a touch sensor and a force sensor.

The features, structures and effects and the like described in the embodiments are included in an embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although the embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A touch input device detecting a touch position and a touch pressure magnitude, the touch input device comprising:
   a display module;
   a first electrode and a second electrode which are disposed on a top surface of the display module and are spaced apart from each other;

a spacer layer which is formed on the top surface of the display module and covers the first electrode and the second electrode, and includes nanoparticles; and a transparent ground electrode which is disposed on the spacer layer, is disposed above the first electrode and the second electrode, and is formed of a material having transparency, wherein the transparent ground electrode is disposed at a height equal to or greater than a height at which an electric field region is formed between the first electrode and the second electrode, wherein when the spacer layer is compressed, a dielectric constant between the first electrode and the second electrode is increased by a density change of the nanoparticles and wherein a pressure magnitude of a touch is detected based on the increased dielectric constant.

2. The touch input device of claim 1, wherein the first electrode and the second electrode are formed on different layers on the display module.

3. The touch input device of claim 1, wherein the height at which an electric field region is formed between the first electrode and the second electrode is determined by the following equation, $$\text{Height }(T) = a\sqrt{\left(1+\frac{w}{a}\right)^2 - 1}$$

where a is a half of a gap between the first electrode and the second electrode, and w is a half of a width of the first electrode or a half of a width of the second electrode.

4. The touch input device of claim 1, wherein a capacitance change between the transparent ground electrode and the first electrode does not occur as the touch is applied.

5. The touch input device of claim 1, wherein a drive signal is applied to the first electrode, and a reception signal is generated from the second electrode by the applied drive signal, and then a capacitance change amount between the first electrode and the second electrode is detected from the reception signal.

6. The touch input device of claim 5, further comprising a drive signal provider which provides the drive signal, and a signal detector which receives the reception signal.

7. A touch input device which detects a position of a touch input to a touch surface and a pressure magnitude of the touch, the touch input device comprising:
a plurality of sensors;
an insulating layer which is disposed on the plurality of sensors, is composed of an elastic material, and includes a plurality of conductive materials wherein the plurality of conductive materials are a plurality of nanoparticles; and
a ground layer which is disposed on the insulating layer and is disposed on some sensors among the plurality of sensors,
wherein when the insulating layer is compressed, a dielectric constant of the insulating layer is increased by a density change of the nanoparticles, and
wherein the pressure magnitude of the touch is detected based on the increased dielectric constant.

8. The touch input device of claim 7,
wherein some of the sensors comprise a drive sensor and a sensing sensor, wherein, when the insulating layer is compressed, the number of the plurality of conductive materials per unit area is increased, so that the dielectric constant of the insulating layer is increased, wherein, when the dielectric constant of the insulating layer is increased, a capacitance between the drive sensor and the sensing sensor is increased, and wherein the increase of the capacitance is detected through a change of an electrical characteristic value which is output from the sensing sensor, so that the pressure magnitude of the touch input to the touch surface is detected.

9. The touch input device of claim 7, wherein, as a weight ratio of the plurality of conductive materials included in the insulation layer increases, a change rate of the capacitance is increased.

10. The touch input device of claim 7,
wherein the ground layer is not disposed on remaining sensors other than some of the sensors among the plurality of sensors,
wherein the remaining sensors comprise a drive sensor and a sensing sensor,
wherein, when the insulating layer is compressed, a capacitance between the drive sensor and the sensing sensor is decreased,
and wherein the increase of the capacitance is detected through a change of an electrical characteristic value which is output from the sensing sensor, so that the position of the touch input to the touch surface is detected.

11. The touch input device of claim 7, further comprising a display module comprising a plane on which the plurality of sensor are disposed.

12. The touch input device of claim 11, wherein the plane has an embossing structure.

13. The touch input device of claim 7, further comprising:
a base layer comprising a plane on which the plurality of sensors are disposed; and
a display module disposed under the base layer.

14. The touch input device of claim 13, wherein the base layer is made of a material having a lower modulus of elasticity than that of the insulating layer.

15. The touch input device of claim 13, wherein the plane has an embossing structure.

16. The touch input device of claim 7, wherein a ratio of the gap between two adjacent sensors among the plurality of sensors, based on a width of the one sensor is equal to or greater than 10.

17. The touch input device of claim 7,
wherein the plurality of sensors comprise a plurality of drive sensors arranged in a row direction and a plurality of sensing sensors arranged in a column direction,
and wherein the one or more ground layers are arranged in the column direction.

18. The touch input device of claim 17,
wherein the ground layer is disposed on one or more sensing sensors among the sensing sensors,
and wherein the ground layer is disposed on one or multiple drive sensors which are adjacent to the sensing sensor disposed under the ground layer among the drive sensors.

19. The touch input device of claim 18, wherein the ground layer is disposed on a portion of one or multiple drive sensors which are adjacent to the sensing sensor disposed under the ground layer.

* * * * *